United States Patent [19]
Hack et al.

[11] Patent Number: 4,984,041
[45] Date of Patent: Jan. 8, 1991

[54] HIGH VOLTAGE THIN FILM TRANSISTOR WITH SECOND CONTROL ELECTRODE

[75] Inventors: Michael Hack, Mountain View; John G. Shaw, Portola Valley, both of Calif.

[73] Assignee: Xerox Corporation, Stamford, Conn.

[21] Appl. No.: 387,324

[22] Filed: Jul. 28, 1989

[51] Int. Cl.[5] .................... H01L 27/01; H01L 27/13; H01L 29/78; H01L 27/12
[52] U.S. Cl. ...................... 357/23.7; 357/4; 357/15; 357/59; 357/23.14; 307/304
[58] Field of Search .................... 357/23, 7, 4, 15, 59, 357/23.14; 307/304

[56] References Cited

U.S. PATENT DOCUMENTS

| | | | |
|---|---|---|---|
| 4,598,305 | 7/1986 | Chiang | 357/4 |
| 4,716,446 | 12/1987 | Esser et al. | 357/41 |
| 4,752,814 | 6/1988 | Tuan | 357/23.8 |
| 4,882,295 | 11/1989 | Czubatyj et al. | 357/23.7 |

FOREIGN PATENT DOCUMENTS

| | | | |
|---|---|---|---|
| 0304824 | 3/1989 | European Pat. Off. | 357/23.7 |
| 59-163871 | 9/1984 | Japan | 357/23.7 |
| 61-097964 | 5/1986 | Japan | 357/23.7 |
| 61-215520 | 9/1986 | Japan | 357/23.7 |
| 63-003464 | 1/1988 | Japan | 357/23.7 |
| 63-141378 | 6/1988 | Japan | 357/23.7 |

OTHER PUBLICATIONS

Martin et al., "Enhancement of Performance and Reliability of Amorphous Silicon High Voltage Thin Film Transistors by Use of Field Plates", IEDM 1989, pp. 341-364.

Mimura et al., High Performance Low-Temp Poly-Si N Channel TFT for LCD, 2/1989, pp. 351-358.

Unagami, High-Voltage Poly-Si TFT w/Mutichannel Structure, 12-1988, IEEE, pp. 2363-2367.

Primary Examiner—Andrew J. James
Assistant Examiner—Daniel Kim

[57] ABSTRACT

A high voltage thin film transistor comprising an amorphous semiconductor charge transport layer, laterally disposed source and drain electrodes, a first control electrode with one edge laterally overlapping the source electrode and an other edge laterally spaced from the drain electrode. A source of high potential is applied to the drain electrode and a source of low potential is applied to the first control electrode in a time varying manner so as to form an accumulation channel in the charge transport layer, opposite to the first control electrode. Device performance is improved by including a second control electrode disposed in the same plane as the first control electrode and biased for preventing the formation of defects within the charge transport layer adjacent the other edge.

4 Claims, 2 Drawing Sheets

HIGH VOLTAGE THIN FILM TRANSISTOR WITH SECOND CONTROL ELECTRODE

FIELD OF THE INVENTION

This invention relates to an amorphous silicon high voltage thin film transistor having a second control electrode for providing increased performance stability.

BACKGROUND OF THE INVENTION

Electronic technology today relies almost exclusively on crystalline silicon with compound semiconductors, such as GaAs, occupying small, but important, niches in optoelectronic and high speed applications. Amorphous silicon device configurations have rapidly progressed in both their performance and stability since the first report in 1979 by LeComber et al (Electronic Letters 15, 179 [1979]) of an amorphous silicon field effect transistor. Amorphous silicon technology has emerged as a prime candidate for large area thin film applications, first in photovoltaic applications and later in large area integrated circuits used in flat liquid crystal displays, solid state imagers, electronic copiers, printers and scanners. This semiconductor material is ideally suited for large area arrays (in excess of 12 inches by 12 inches) because the low deposition temperatures involved in its glow discharge fabrication process, make possible the use of inexpensive substrate materials, such as glass.

By comparison to crystalline silicon devices, the main difference with amorphous silicon devices is the relatively low electron band mobility ($\leq 20$ cm$^2$/Vs) of the latter coupled with a relatively large density of localized states. This results in amorphous silicon devices having a slower switching time than single crystalline devices. However, in many large area applications, such as printing, since numerous operations can be performed in parallel, the overall system speed is quite fast. Furthermore, since amorphous silicon has a wide effective energy gap, an extremely large photoconductivity and good light sensitivity, it is uniquely suited for optoelectronic applications, particularly in the visible range.

In U.S. Pat. No. 4,752,814 (Tuan) entitled "High Voltage Thin Film Transistor", assigned to the same assignee as the present application, there is taught a unique a-Si:H transistor device which may be operated at 500 volts, or more. In operation, several hundreds of volts can be switched by a low voltage gate signal. Fabrication of this high voltage transistor is compatible with low voltage amorphous silicon TFTs. This known transistor structure is shown in FIG. 1 and a typical example of its initial $I_{DS}$ vs. $V_{DS}$ characteristics are shown in curve A of FIG. 3. However, this amorphous silicon transistor will not be stable under certain operating conditions because after being stressed its characteristics can shift, as indicated by curve B of FIG. 3. Electrostatic stressing will occur on the order of minutes, in response to a history of applied voltages. The illustrated shift to higher $V_{DS}$ values is undesirable because it could degrade the performance of the HVTFT in circuit applications. In order to describe this shift, the parameter $V_x$ has been defined. It is shown in FIG. 3 as the x-axis crossing of a tangent to the inflection point of the $I_{DS}$ vs. $V_{DS}$ curve.

Therefore, it is the primary object of the present invention to greatly reduce the $V_x$ shift, in order to enable the amorphous silicon HVTFT to have more uniform operating characteristics regardless of its electrostatic stress history.

SUMMARY OF THE INVENTION

The present invention may be carried out, in one form, by providing a high voltage thin film transistor comprising an amorphous semiconductor charge transport layer, laterally disposed source and drain electrodes located adjacent to the charge transport layer, means for applying a high electrical potential to the drain electrode, a gate dielectric layer located adjacent to the charge transport layer, a first control electrode having one edge laterally overlapping the source electrode and an other edge extending toward and laterally spaced from the drain electrode, and means for applying a time variable electrical potential to the first control electrode so as to turn the device ON and OFF. The improvement comprises a second control electrode coplanar with the first control electrode, separated from the charge transport layer by the gate dielectric layer, and laterally spaced from the first control electrode and the drain electrode, and means for applying an electrical potential to the second control electrode, when the first control electrode is turned OFF, for preventing the formation of defects within the charge transport layer adjacent the other edge.

The high voltage thin film transistor described herein is a modification to the transistor described in a related application entitled "High Voltage Thin Film Transistor With Second Gate", filed on June 15, 1989 by the same assignee as the present invention.

DETAILED DESCRIPTION OF THE DRAWINGS

Figure 1:
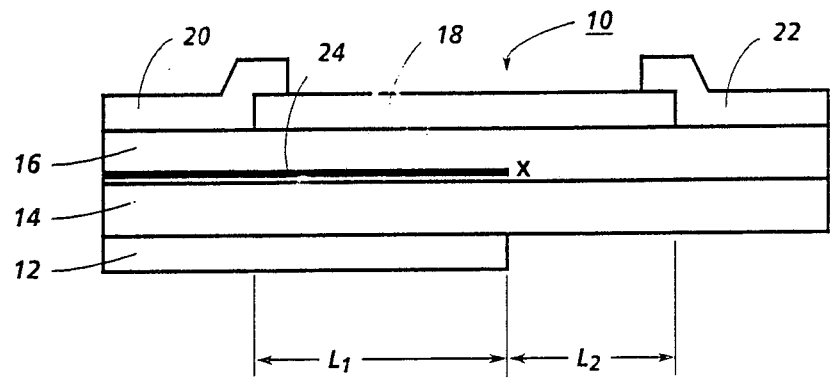
FIG. 1 illustrates a known amorphous silicon high voltage thin film transistor.

The amorphous silicon HVTFT 10 shown in FIG. 1 is supported upon a substrate (not shown) which may be a sheet of glass or other material which is readily available in large area format, and is compatible with the device fabrication temperatures, on the order of 250° C. In fabrication, a layer of chromium is deposited upon the substrate and is patterned and etched to form a gate electrode 12. Then a gate dielectric layer 14 of silicon nitride is deposited, followed by the plasma enhanced CVD deposition of charge transport layer 16 which is substantially intrinsic, or lightly doped, amorphous silicon. A top nitride layer 18 is deposited upon the amorphous silicon layer, and then it is patterned and etched to form vias for a deposited layer of phosphorus doped (n-type) amorphous silicon which in turn is etched to form the source electrode 20 and the drain electrode 22. Chrome contacts overlying the n-type electrodes are not shown. The materials described are only set forth by way of example.

Current through the charge transport layer is controlled by gate electrode 12 which is laterally offset from the drain electrode 22. The remainder of the charge transport layer comprises a "dead" (ungated)

region of length $L_2$. In the OFF condition of the transistor, when a bias of 0 volts is applied to the gate electrode, no current flows between the source and drain electrodes despite the high drain voltage of several hundred volts which is dropped across the "dead" region because the source electrode is shielded from the drain potential by the gate electrode. In the ON condition, a potential of 5 to 20 volts is applied to the gate electrode inducing a highly conductive accumulation channel 24 of length $L_1$ adjacent to the interface of the charge transport layer and the gate dielectric layer, and charge carriers are pulled by the drain field from the accumulation channel through the dead region and into the drain electrode. Of the approximately 500 Å thick amorphous silicon layer, the accumulation channel is very thin so that most of the current is confined to within about 30 Å of the interface with the gate dielectric layer. Once the current passes into the dead region it spreads to flow through the bulk of the charge transport layer. Current in the dead region is space charge limited and, as such, is proportional to approximately $V^4/L_2^7$ (i.e. directly to the fourth power of the voltage and inversely to the seventh power of the dead region length).

Figure 3:
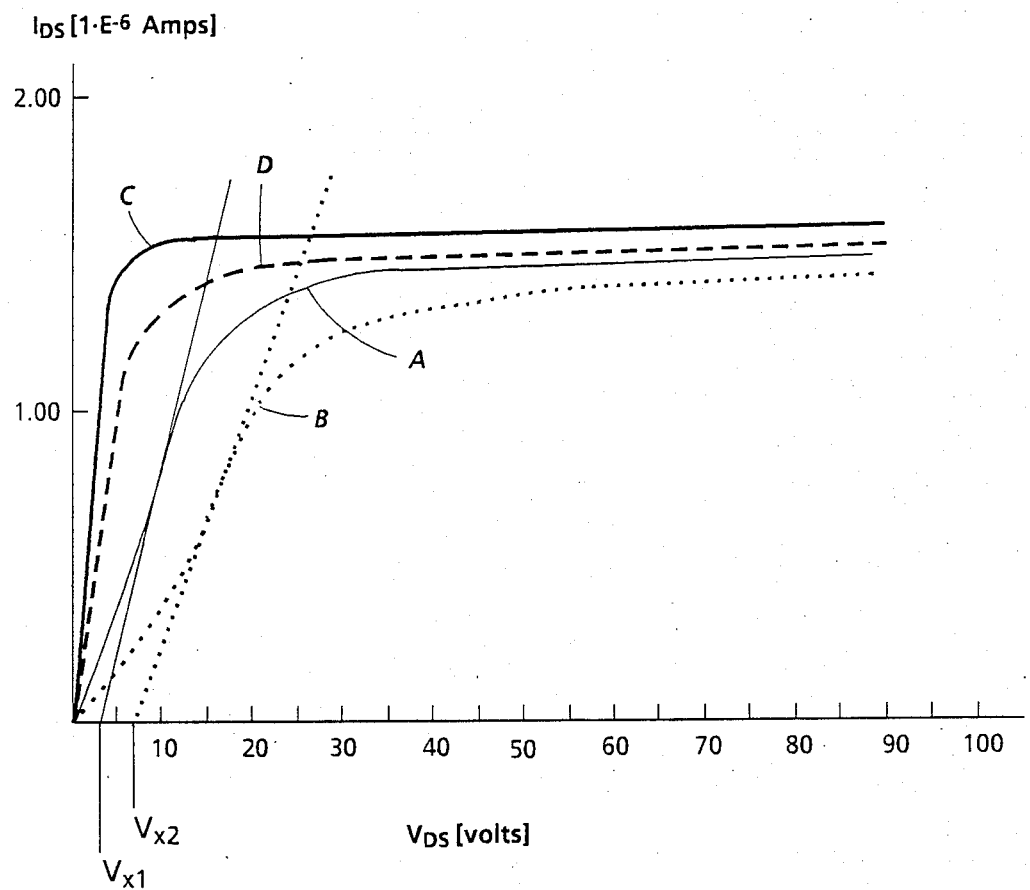
FIG. 3 illustrates the initial and post stress characteristic $I_{DS}$ vs. $V_{DS}$ curves of the HVTFT shown in FIG. 1 as well as these characteristic curves of the device of the present invention.

In FIG. 3, the $I_{DS}$ vs. $V_{DS}$ characteristic curve A of this known device may be viewed as being comprised of two distinct regions. At lower drain voltages the source-to-drain current exhibits a positive curvature indicative of space charge limited current, including an initial rapid rise followed (at the point of inflection) by a decreasing rate of rise, and a saturation region including a knee and a leveling off of the current. The physics of electron flow through the device is such that in the ON state, with the channel accumulated, increases in the drain voltage raise the horizontal electric field and draw increasingly more current from the accumulation region into the "dead" $L_2$ region. This condition continues until the electric field at the boundary between the gated and the "dead" regions reaches a value which saturates the current flow in the gated region by limiting the injection of charge from the accumulation channel into the "dead" region.

While a desirable transistor would have a low $V_{ON}$, electrostatic stressing thereof, by a high drain potential with the gate electrode below threshold, shifts the characteristic curve to the right, as shown in curve B in FIG. 3, resulting in an increased $V_{ON}$. This latter effect has been termed the $V_x$ shift because the $V_x$ differential $(V_{x2}-V_{x1})$ is an indication of the extent of curve shifting. The present invention ameliorates this situation, thereby reducing the transistor's $V_{ON}$ and stabilizing it.

The following hypothesis proposes to explain the $V_x$ shift phenomenon and a solution to this problem. During the OFF state of the FIG. 1 type of high voltage transistor, i.e. when high voltage is applied to the drain electrode while the gate is held at the source potential of 0 volts, a severe electrostatic stress condition exists. No electrons can flow into the dead region ($L_2$) of the amorphous silicon charge transport layer and any free electrons in that region are swept out by the large drain field, resulting in a severe depletion of carriers therefrom. When depleted of electrons by this electrostatic stress, the Fermi level of the amorphous silicon layer is pulled down toward the valence band. At normal operating temperatures the amorphous silicon equilibrates, i.e. its electronic structure responds to changes in its Fermi level position, whereby the material generates new defects, or traps, to bring the Fermi level back up to mid-gap. The distribution and density of localized states in the equilibrated amorphous silicon material depend upon the Fermi level position and the thermal energy, giving rise to significant effects. The increased number of traps when full hold more electrons and impedes their movement through the material. Even after the stress condition has been removed, by the device being switched to its ON state, this extra set of defects reduces current output for a given drain potential and necessitates an increased drain field to move the charge carriers into the dead region. It should be noted that this shift of the $I_{DS}$ vs. $V_{DS}$ curve ($V_x$ shift), predicated upon the phenomenon of equilibration, occurs in amorphous silicon but not in crystalline silicon whose electronic structure does not vary significantly with temperature and Fermi level position.

In the OFF state of the transistor the amorphous silicon layer is depleted by the lateral drain field. Additionally, at the transition region (identified as "x") between the gated and "dead" zones of the amorphous silicon layer, near to the interface with the dielectric layer 14, where there is a lateral drain field, caused by the normal field induced by the differential between the 0 volts on the first gate electrode and the 0+ volts (perhaps 10 or 20 volts), further depletion will occur. Therefore, an abundance of localized states appears at the transition region x where there is produced a potential barrier inhibiting injection of charge carriers into the "dead" region. In the ON state of the transistor, since charge carriers are confined to movement through the thin accumulation channel 24, any defects in the transition region x have a "bottleneck" effect on the flow of charge and adversely affect the transistor characteristics by greatly reducing the injection of charge carriers into the dead region, which is manifested by requiring increased $V_{DS}$ to overcome it (the $V_x$ shift). Of course, defects in the bulk of the dead region will also have some deleterious effects, but their result is not as pronounced because the charge carriers are able to spread out through the bulk of the amorphous silicon layer.

Figure 2:
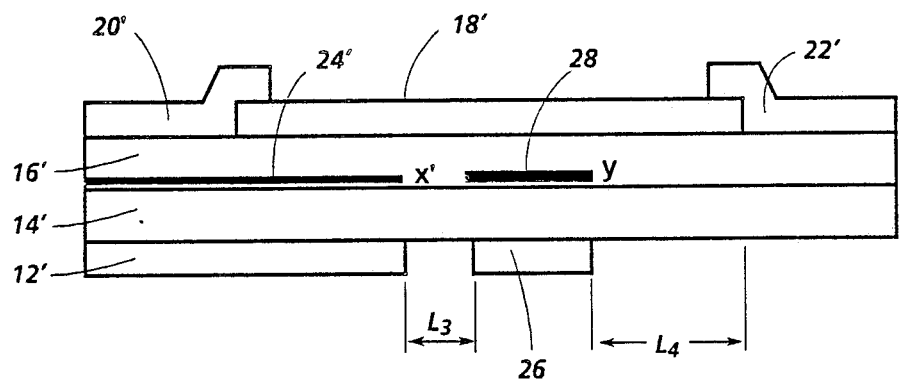
FIG. 2 illustrates the dual gated amorphous silicon high voltage thin film transistor of the present invention.

Turning to FIG. 2 there is shown a high voltage thin film transistor modified in accordance with the present invention so as to substantially eliminate the deleterious $V_x$ shift and to improve the transistor characteristics. For ease of understanding, similar elements are numbered with the same numerals, as used in describing the FIG. 1 device, with the addition of a prime ('). In a single deposition step there is deposited upon a substrate (not shown) a first chromium layer about 800 Å thick which is patterned to form a first control electrode 12' and a second control electrode 26, laterally spaced by the distance $L_3$. Over these electrodes there is deposited about 3000 Å of silicon nitride to form gate dielectric layer 14' and about 500 Å of amorphous silicon to form charge transport layer 16'. A top silicon nitride layer 18' about 2000 Å thick overlies the amorphous silicon layer, and is etched to form vias for receiving an n+ amorphous silicon deposition about 1000 Å thick which is patterned into a source electrode 20' and a drain electrode 22'. The drain electrode is laterally spaced from the second gate electrode by the distance $L_4$, which is comparable to the distance $L_2$ in order to prevent dielectric breakdown between these electrodes. However, since the potential difference between these electrodes will be less than that between the drain electrode and the gate electrode in the FIG. 1 transistor, it is possible to diminish slightly the distance $L_4$.

In operation, the bias on the first control electrode 12' is turned ON and OFF in a time varying manner, while the bias applied to the second control electrode 26 is steadily ON. Alternatively, it is possible to allow the second control electrode to float electrically or to be biased only when the high electrostatic stressing condition is present, i.e. when the bias on the first control electrode is turned OFF. It is well understood that the effect of applying a bias, on the order of about 10 volts, to the first control electrode will induce the thin, highly conductive, accumulation channel 24' in the amorphous silicon layer opposite to it, due to the field established between it and the grounded source electrode. The proximity of the second control electrode 26 (biased on the order of 20 to 50 volts) to the amorphous silicon layer causes the facing portion of the amorphous silicon layer to float to approximately the same potential, hence there will be no, or only a small, normal electric field. Since there is no large electric field normal to the second control electrode 26, the amorphous silicon layer, at most, will support a more diffuse, weaker conducting channel, as represented by the thicker line 28.

In the OFF state of the transistor, the presence of the biased second control electrode 26 limits the drain field depletion of the amorphous silicon layer to the $L_4$ dead region with deeper depletion of the transition region y, which is not a critical region, as will be explained. The second control electrode screens the $L_3$ dead region from the drain field, that dead region will see only the second control electrode field. Since the second control electrode field is substantially lower than the drain potential, depletion through $L_3$ will be much reduced and, in particular, there will be substantially less depletion at the transition region x' (as indicated by the reduced size of the reference in FIG. 2). In the ON state of the transistor, current flows through the 20 Å accumulation channel and then enters the dead region $L_3$, bypassing the few additional defects in the transition region x', where it spreads through the bulk of the amorphous silicon. The current will be less confined in the weak channel 28, and may spread somewhat through the bulk, so that the defects at the transition region y will not present a significant barrier thereto. Finally, the current flows through the $L_4$ dead region under the influence of the drain field.

The modified high voltage thin film transistor device of this invention, having the continuously biased second control electrode, prevents the critical transition region x of the amorphous silicon charge transport layer, adjacent to the accumulation channel, from going into deep depletion under the influence of the high potential drain field, and the $V_x$ shift is inhibited. Therefore, this device is stabilized so that there is very little change in operating characteristics before and after stress. Additionally, $V_{ON}$ is reduced because the dead region $L_4$ may be made shorter than the dead region $L_2$ since the potential drop across $L_4$ is less than across $L_2$. This greatly increases the space charge limited current in accordance with the $1/L_2^7$ relationship of space of charge limited current to the length of the dead region. These described benefits can be readily observed in curves C and D of FIG. 3 which represent the unstressed and stressed conditions of the modified high voltage thin film transistor.

It should be understood that the present disclosure has been made only by way of example and that numerous other changes in details of construction and the combination and arrangement of elements may be resorted to without departing from the true spirit and scope of the invention as hereinafter claimed.

What is claimed:

1. A high voltage thin film transistor comprising an amorphous semiconductor charge transport layer, laterally disposed source and drain electrodes located adjacent to said charge transport layer, a source of reference potential connected to said source electrode, a gate dielectric layer located adjacent to said charge transport layer, a first control electrode separated from said charge transport layer by said gate dielectric layer, said first control electrode having one edge laterally overlapping said source electrode and an other edge laterally spaced from said drain electrode, a source of high electrical potential connected to said drain electrode and a source of low electrical potential connected to said first control electrode for forming a conducting channel in said charge transport layer at a location opposite to said first control electrode in a time varying manner, said transistor being characterized by including a second control electrode being coplanar with said first control electrode, being separated from said charge transport layer by said gate dielectric layer, and being laterally spaced from said first control electrode and said drain electrode, and a source of electrical potential, of a value intermediate said high and said reference electrical potentials, connected to said second control electrode, for preventing depletion of carriers within said charge transport layer adjacent said other edge of said first control electrode.

2. The high voltage thin film transistor as defined in claim 1 characterized in that said charge transport layer is comprised of amorphous silicon.

3. A high voltage thin film transistor comprising an amorphous semiconductor charge transport layer, laterally disposed source and drain electrodes located adjacent to said charge transport layer, a gate dielectric layer located adjacent to said charge transport layer, a control electrode separated from said charge transport layer by said gate dielectric layer, said control electrode having one edge laterally overlapping said source electrode and an other edge laterally spaced from said drain electrode, a source of high electrical potential connected to said drain electrode, and a source of low electrical potential connected to said control electrode for forming a conducting channel in said charge transport layer at a location opposite to said control electrode in a time varying manner, said transistor being characterized by including control means disposed in the same plane as said control electrode for preventing the formation of defects within said charge transport layer adjacent said other edge of said control electrode.

4. The high voltage thin film transistor as defined in claim 3 characterized in that said charge transport layer is comprised of amorphous silicon.

* * * * *